(12) United States Patent
Chakravarti et al.

(10) Patent No.: US 6,528,383 B1
(45) Date of Patent: Mar. 4, 2003

(54) SIMULTANEOUS FORMATION OF DEEP TRENCH CAPACITOR AND RESISTOR

(75) Inventors: Satya N. Chakravarti, Hopewell Junction, NY (US); Ashima B. Chakravarti, Hopewell Junction, NY (US); Irene L. McStay, Hopewell Junction, NY (US); Kwong Hon Wong, Wappingers Falls, NY (US)

(73) Assignees: International Business Machines Corporation, Armonk, NY (US); Infineon Technologies AG, Munich (DE)

(*) Notice: Subject to any disclaimer, the term of this patent is extended or adjusted under 35 U.S.C. 154(b) by 0 days.

(21) Appl. No.: 10/016,016

(22) Filed: Dec. 12, 2001

(51) Int. Cl.⁷ .............................. H01L 21/00
(52) U.S. Cl. .................. 438/381; 438/382; 438/386
(58) Field of Search ............. 438/381, 382, 438/386, 387, 389, 391, 392; 257/528, 532, 533, 536

(56) References Cited

U.S. PATENT DOCUMENTS 5,554,870 A * 9/1996 Fitch et al. ................. 257/334
6,093,968 A * 7/2000 Honeycutt et al. .......... 257/765

OTHER PUBLICATIONS

Oehriein, et al., "Interactive Effects in the Reactive Ion Etching of SiGe–Alloys", IBM Research Report, RC 16529, Feb. 11, 1991.

Carns, et al., "Chemical Etching of $Si(1-x)Ge(x)$ in $HF:H_2O_2:CH_3COOH$", J. Electrochem. Soc., vol. 142, No. 4, Apr. 1995, p 1260–1266.

Li, et al., "Germanium as a Versatile Material for Low–Temperature Micromachining", Journal of Microelectromechanical Systems, vol. 8, No. 4, Dec. 1999, p 366–372.

* cited by examiner

Primary Examiner—Kamand Cuneo
Assistant Examiner—Evan Pert

(57) ABSTRACT

A compact resistor is formed in an integrated circuit using many of the same steps as are employed in forming a trench capacitor for a DRAM cell; in particular depositing a layer of heavily doped germanium in the trench interior after the step of doping the substrate to form the bottom plate for the capacitor, depositing polysilicon having the required resistivity in the trench then removing the germanium and leaving only enough to form an ohmic contact in the trench bottom.

7 Claims, 4 Drawing Sheets

SIMULTANEOUS FORMATION OF DEEP TRENCH CAPACITOR AND RESISTOR

FIELD OF THE INVENTION

The field of the invention is integrated circuit processing, including circuits having resistors.

BACKGROUND OF THE INVENTION

When a circuit requires a resistor, conventional processing uses a strip of polysilicon or an implanted area in the substrate, the dimensions and amount of doping being set to give the desired resistance. Both these approaches are planar and require substantial chip area, as well as additional processing steps to give a resistivity that is different from the resistivity of poly interconnect or sources and drains.

As IC dimensions shrink, the extra area required for a planar resistor becomes more of a burden.

SUMMARY OF THE INVENTION

The invention relates to a method of forming vertical resistors that employs steps that are used for forming a deep trench capacitor in a DRAM.

A feature of the invention is the use of a germanium liner in a deep trench that can be selectively removed to isolate a vertical resistive element placed in the trench from the substrate, while still making ohmic contact with the substrate at the bottom of the trench.

DESCRIPTION OF THE PREFERRED EMBODIMENT

Figure 1:
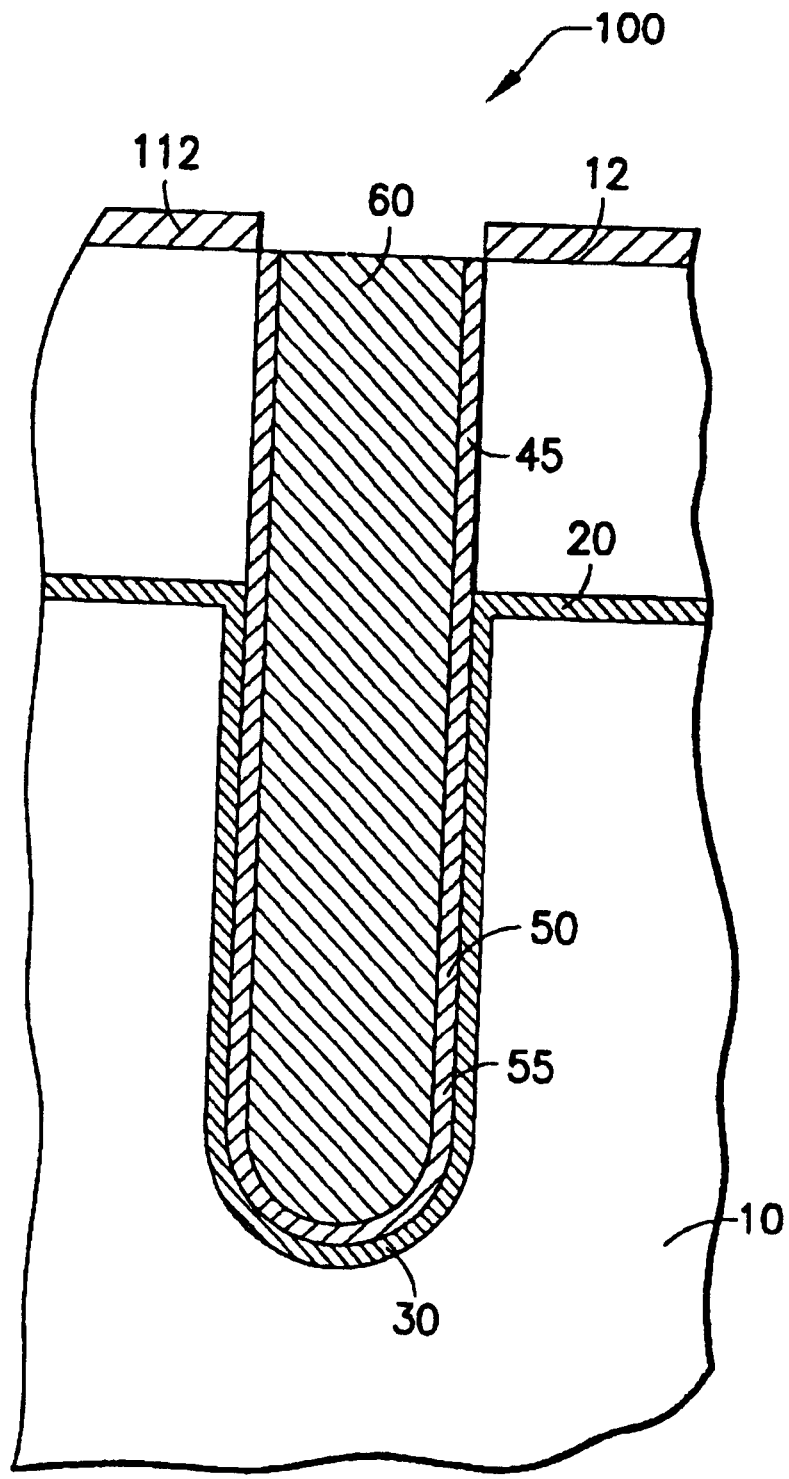
FIG. 1 shows, in partially schematic, partially pictorial form, a cross section of a resistor constructed according to the invention.
Figure 2:
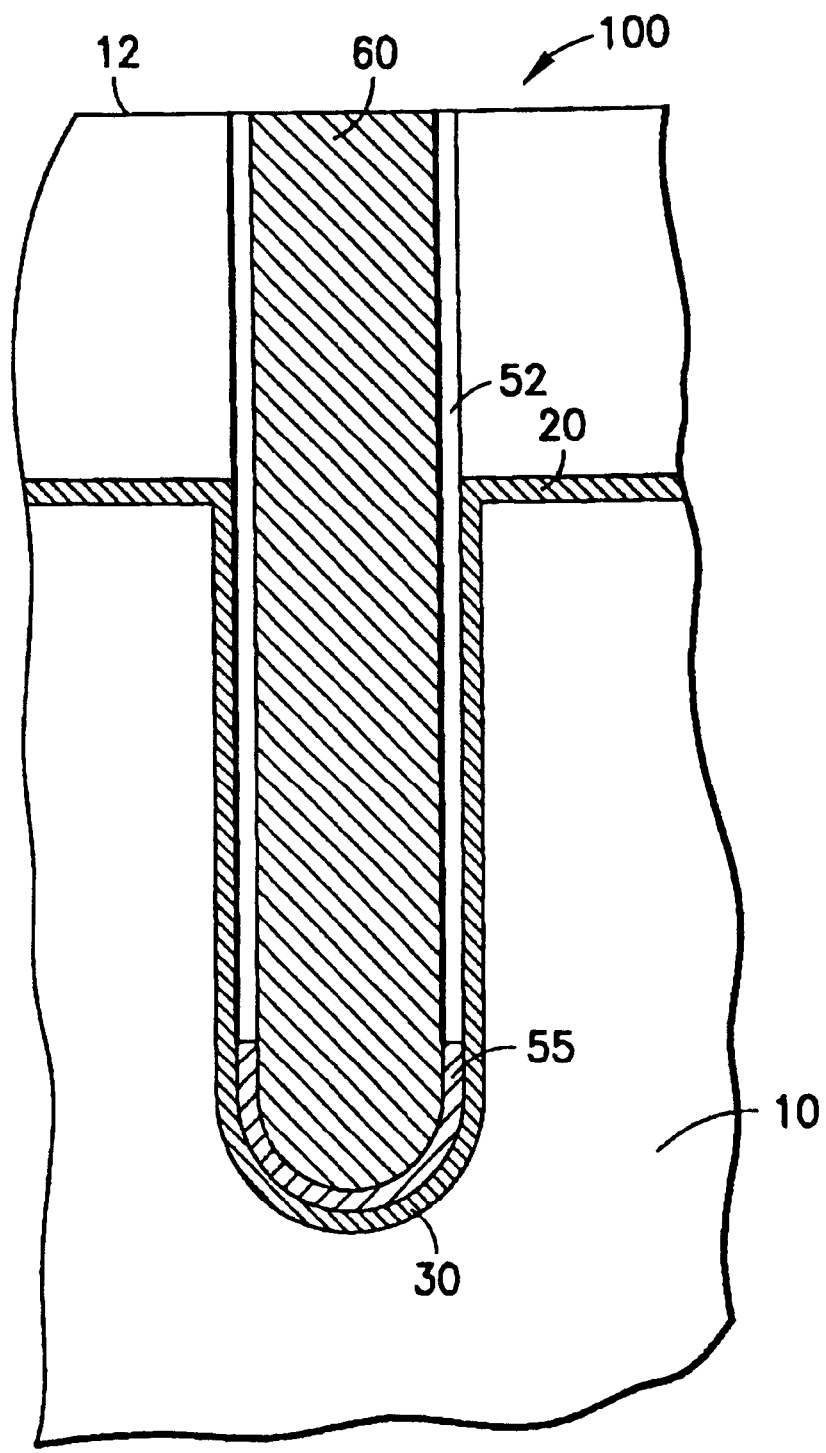
FIG. 2 shows, in partially schematic, partially pictorial form, a cross section of preliminary step in the process.

Referring now to FIGS. 1 and 2, there is shown a cross section of a partially constructed resistor according to the invention, denoted generally with the numeral 100, formed in substrate 10. Substrate 10 typically comprises a semiconductor material such as single-crystal silicon and may include other conductive layers or other semiconductor elements, such as transistors or diodes, for example. Substrate 10 may alternatively comprise compound semiconductors, such as GaAs, InP, Si/Ge, or SiC.

A pad nitride 112 is shown as deposited over the substrate 10. Pad nitride 112 may comprise 100–300 nm of silicon nitride, for example. An optional oxide layer 12 may be deposited below nitride 112 to reduce stress effects. Wafer 100 is patterned using conventional lithography techniques and etched to form deep trenches, passing through nitride 12 and penetrating substrate 10 to a cell depth. Examples of deep trenches are about 6 $\mu$m deep and 200 nm in diameter or 10 $\mu$m deep and 100 nm in diameter and will depend on the particular ground rules in use.

In a preliminary step, the buried plate of the trench capacitors in the DRAM cell array has been formed by (i) implanting a dose of As ions into the bottom of the trench that, after annealing, form region 30 and by depositing N+ As-doped glass in the trench and heating it to diffuse the As into substrate 10 to form region 30. An alternative method of forming region 30 is a gas-phase doping, e.g. injecting arsine gas at high temperatures, diffusing the arsenic into the silicon sidewalls, to form a highly-doped region 30. Next, (ii) n-doped layer 20 (termed N-band) is formed by implanting a dose of N-type ions into the p-type substrate at a depth of about 1 $\mu$m below the wafer surface. This buried plate (formed from regions 20 and 30) extends to contact a set of at least two trenches and is tied to a power supply terminal (usually ground) through the substrate conductivity and through optional low-impedance paths (not shown) to a connection that rises up to the substrate surface.

A layer of N+ germanium 55 (5 nm–50 nm thick) has been deposited on the interior walls of the trench. In turn, a plug of N-doped poly 60 has been deposited to fill the trench with a material having the right resistivity to form a resistor with the desired resistance.

Referring now to FIG. 2, since the Ge layer 55 is conductive, it is etched back in a timed etch, leaving a portion, denoted with the numeral 55, on the bottom that forms an ohmic contact between the buried plate 30 and the bulk of the resistor 60. The remaining open space is denoted with the numeral 52 in FIG. 2. In FIG. 1, space 52 has been filled by deposition of any convenient dielectric 45, such as oxide, nitride or nitrided oxide. An illustrative version is CVD nitride. Illustratively, the Ge etch may be a RIE using SF6/H2/CF4 plasmas (Beolwick et al. IBM Technical Disclosure Bulletin 1992) or a wet etch using KOH (Carns, et al. J. Electrochemical Soc. 142, 4, p1260, 10:1) or HNO3 (B. Li et al., J. Microelectromechanical Systems, 8, 4 p366) for greater (600:1) selectivity. In either case, the etch ratio between the Ge and the poly 60 is very large, so that no significant damage is done to poly 60 or to substrate 10. At the end of the steps shown in FIG. 2, resistor 100 makes contact at the bottom with the buried plate and has a top surface available to contact other circuit elements.

In a preferred embodiment, the deep trenches of the capacitors of a DRAM array are formed simultaneously with the resistors, since the deep trench etch is a slow and expensive process. If necessary, the trenches for the resistors may be etched at a different time than the capacitors (or if there is no DRAM array in a particular chip), but it is more economical to etch the trenches simultaneously and, if necessary, fill the capacitors and resistors at different times. Different fills may be required if the resistivity of the inner capacitor plate (denoted with numeral 62 in FIG. 3) must be significantly different from the resistivity of the resistive material 60. This will also require that the germanium layer in the trench is of opposite polarity (p-type).

Figure 3:
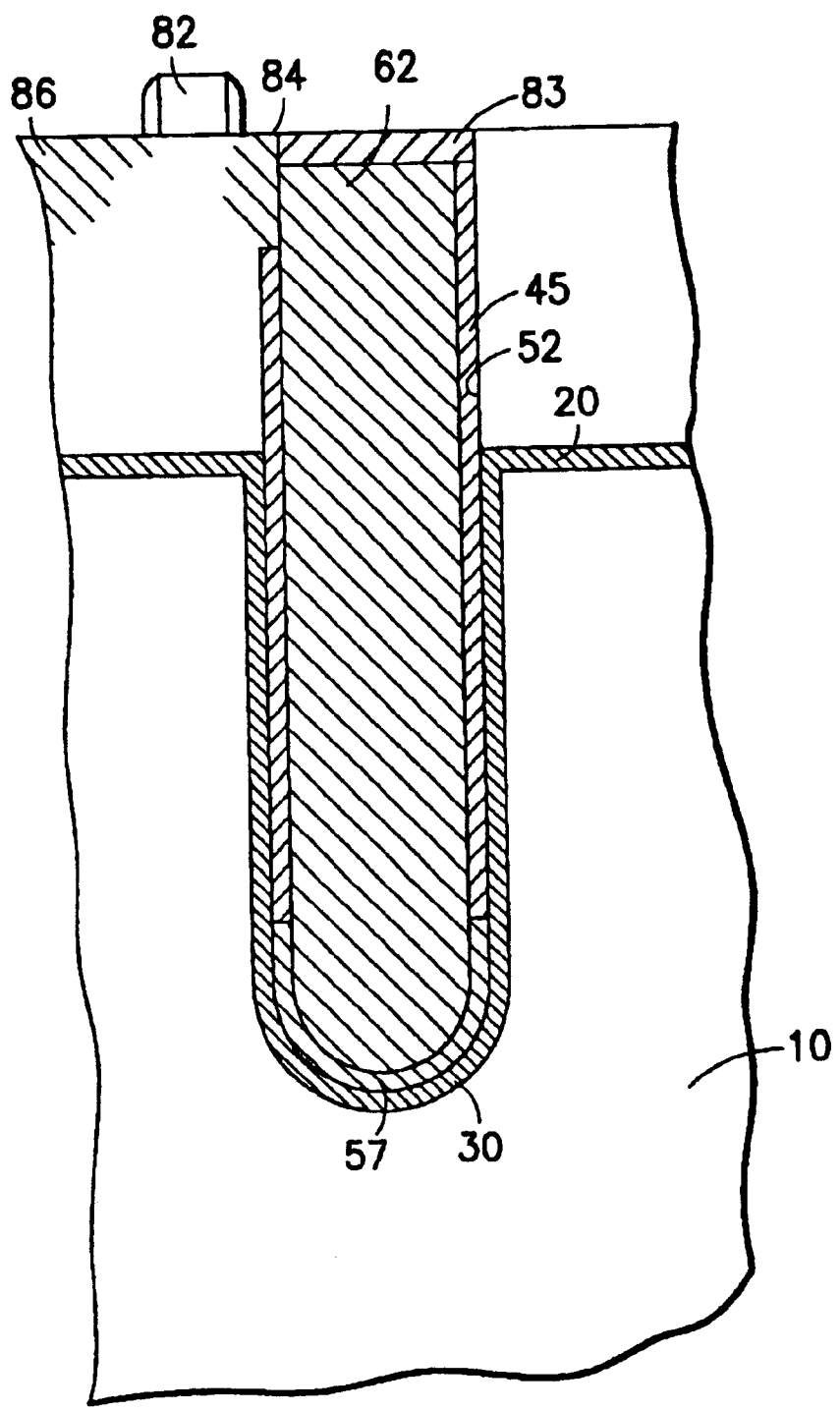
FIG. 3 shows, in partially schematic, partially pictorial form, a cross section of a capacitor constructed in parallel with the resistor of FIG. 1.

Referring now to FIG. 3, there is shown the corresponding DRAM cell. The preliminary steps of etching the trench and forming the buried plate will be the same, but the ohmic contact that is required to connect the resistor to ground can not be tolerated in the capacitor. On the other hand, the Ge layer can not be stripped in the capacitor, because the doped poly central plug would drop down and short the capacitor. Accordingly, before the Ge liner is deposited in the capacitor, a thin (28 nm) layer of thermal oxide 52 is formed. The Ge liner 55 is deposited and recessed the same for both the resistor and for the capacitor.

Then, in a separate step for the capacitor, a heat treatment is carried out in vacuum at a pressure below 10 micro-Torr at a temperature in the range of 450° C. to 700° C. for 5 to 10 minutes. During this heat treatment, the Ge liner will react with the oxide to form GeO 57, which insulates the bottom portion of the capacitor. The remainder of the space 52 is filled in the same way for the resistor and for the capacitor, leaving dielectric 45 that is the same in FIGS. 1 and 3. The thickness of oxide 52 will be set so that a layer of GeO 57 is formed that meets the leakage requirements of the capacitor. It is not necessary that all the Ge be reacted. Illustratively, an oxide thickness of 2.5 nm–25 nm is adequate for the given thickness range of Ge.

At the top of FIG. 3, there is a schematic representation of a conventional DRAM cell structure. Pass transistor 82 accesses the DRAM cell, with buried strap-drain 84 and source 86. An insulating cover 83 protects inner plate 62 from electrical contact.

Figure 4:
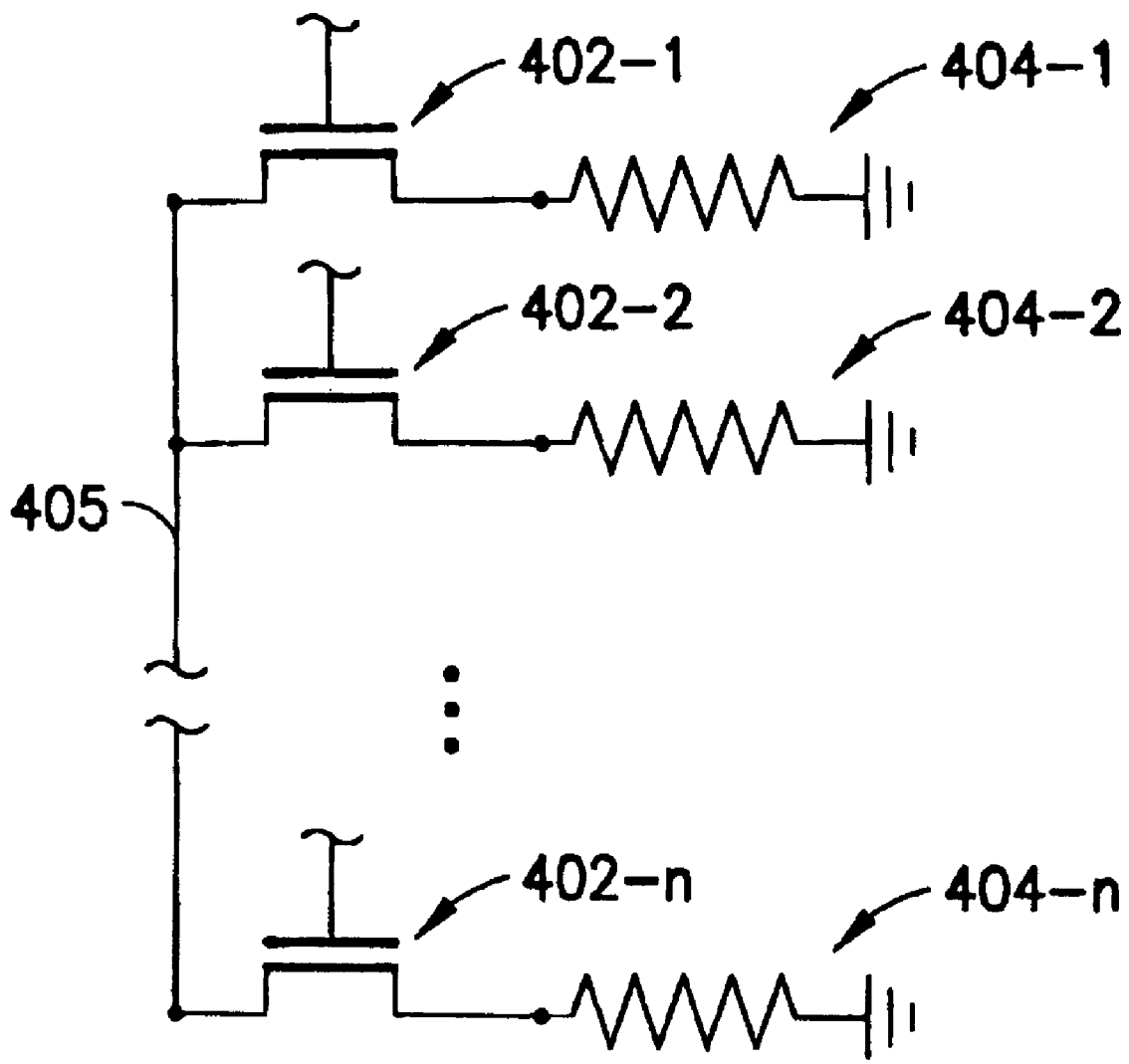
FIG. 4 shows, in schematic form, a set of resistors constructed according to the process.

Optionally, the same DRAM-type pass transistor could be formed at the top of the resistor 100. FIG. 4 illustrates one possible use of such an arrangement. A set of n resistors 404-1 to 404n are connected in parallel between node 405 and ground. Each resistor has the same value, R. If a resistance of R is wanted, then only one transistor 404i is turned on. If a resistance of R/2 is wanted, then two of the transistors are turned on. External contacts (or internal software) permit the circuit designer to select a value (or to permit the end user to select a value) for the net resistance.

Other uses for these resistors will be readily apparent to those skilled in the art, such as connecting two resistors in series—one in a p-well, with the buried plate connected to ground and the other in an n-well, with the buried plate connected to the power supply would permit the connecting node between the two resistors to be set at an intermediate voltage.

The following table illustrates a preferred embodiment, with steps only for the resistor on the left column and steps only for the capacitor on the right column.

| Resistor | Capacitor |
|---|---|
| Prepare the substrate | |
| Etch the trench | |
| Form the buried plate | |
| (implant As at the bottom of the trench, deposit As-doped glass, diffuse the As into the substrate, strip the glass) | |
| Thin thermal oxide | |
| Deposit N$^+$ Ge | |
| Fill N$^+$ doped poly, planarize | |
| Remove in timed etch, leaving a defined layer of Ge at bottom | |
| | Form Ge Oxide at trench bottom |
| Deposit dielectric in former location of Ge | |
| [Optional - Form oxide collar, buried strap, pass transistor] | Form oxide collar, buried strap, pass transistor |
| Ohmic contact at bottom | Capacitor insulated at bottom |

In this table, the phrase "preparing the substrate" refers to preliminary steps, such as pad oxide, pad nitride, threshold implants, etc.

While the invention has been described in terms of a single preferred embodiment, those skilled in the art will recognize that the invention can be practiced in various versions within the spirit and scope of the following claims.

We claim:

1. A method of forming at least one substantially vertical resistor in a semiconductor substrate comprising the steps of:

preparing the substrate;

etching a trench into said substrate to a cell depth;

forming a buried conductive plate outside a lower portion of said trench;

depositing a layer of doped germanium of a first polarity on inner walls of said trench;

depositing resistive material within said trench and in contact with said layer of doped germanium; and removing said layer of doped germanium, selective to said resistive material, leaving a bottom portion of said layer of doped germanium as an ohmic contact between said resistive material and said buried plate, whereby said resistive material comprises a resistor having a first contact on a top surface thereof and a second contact connected to said buried plate.

2. A method according to claim 1, in which:

said at least one resistor comprises a set of at least two resistors; and further comprising the step of:

implanting a horizontal layer of conductive material of said first polarity extending to make contact with buried plates of said at least two resistors, whereby said second contact is common to said set of at least two resistors.

3. A method according to claim 2, in which:

said step of removing said layer of doped germanium, selective to said resistive material is performed separately on a first and a second subset of said set, whereby a bottom portion of said layer of doped germanium in said first subset has a different vertical extent from a bottom portion of said layer of doped germanium of said second subset and therefore each member of said first subset has a different resistance from members of said second subset.

4. A method of simultaneously forming a set of substantially vertical resistors and a set of substantially vertical capacitors in a semiconductor substrate comprising the steps of:

preparing the substrate;

etching a set of trenches into said substrate to a cell depth, said set of trenches comprising a resistor subset for forming said set of resistors and a capacitor subset for forming said set of capacitors;

forming a buried conductive plate outside a lower portion of said set of trenches;

forming a layer of oxide on inner walls of said capacitor subset;

depositing a layer of doped germanium on inner walls of said set of trenches;

depositing resistive material within said set of trenches and in contact with said layer of doped germanium;

removing said layer of doped germanium, selective to said resistive material, leaving a bottom portion of said layer of doped germanium in said set of trenches, whereby said resistive material comprises a resistor having a first contact on a top surface thereof and a second contact connected to said buried plate through an ohmic contact between said resistive material and said buried plate;

heating said substrate in a vacuum, whereby said bottom portion of germanium in said capacitor subset reacts with said layer of oxide to form an insulating retaining member; and filling a set of spaces left after said step of removing said layer of doped germanium with a dielectric, thereby forming said set of resistors and said set of capacitors.

5. A method according to claim 4, further comprising the step of:

implanting a horizontal layer of conductive material of said first polarity extending to make contact with buried plates of at least two members of said set capacitor subset, whereby said second contact is common to said at least two members of said set capacitor subset.

6. A method according to claim 4, further comprising the step of:

implanting a horizontal layer of conductive material of said first polarity extending to make contact with buried plates of at least two members of said resistor subset, whereby said second contact is common to said at least two members of said resistor subset.

7. A method according to claim 4, in which:

said step of removing said layer of doped germanium, selective to said resistive material is performed separately on at least a first and a second member of said resistor subset, whereby a bottom portion of said layer of doped germanium in said first member has a different vertical extent from a bottom portion of said layer of doped germanium of said second member and therefore said first member and said second member have different resistances.

\* \* \* \* \*